(12) United States Patent
Jang et al.

(10) Patent No.: US 9,105,599 B2
(45) Date of Patent: Aug. 11, 2015

(54) SEMICONDUCTOR DEVICES THAT INCLUDE A DIE BONDED TO A SUBSTRATE WITH A GOLD INTERFACE LAYER

(71) Applicant: FREESCALE SEMICONDUCTOR, INC., Austin, TX (US)

(72) Inventors: Jin-Wook Jang, Chandler, AZ (US); Lalgudi M. Mahalingam, Scottsdale, AZ (US); Audel A. Sanchez, Tempe, AZ (US); Lakshminarayan Viswanathan, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/287,141

(22) Filed: May 26, 2014

(65) Prior Publication Data
US 2014/0252586 A1    Sep. 11, 2014

Related U.S. Application Data

(62) Division of application No. 12/683,961, filed on Jan. 7, 2010, now Pat. No. 8,753,983.

(51) Int. Cl.
*H01L 23/48* (2006.01)
*H01L 23/52* (2006.01)
(Continued)

(52) U.S. Cl.
CPC ............ *H01L 23/373* (2013.01); *H01L 23/057* (2013.01); *H01L 23/3731* (2013.01); *H01L 24/27* (2013.01); *H01L 24/29* (2013.01); *H01L 24/32* (2013.01); *H01L 24/83* (2013.01); *H01L 24/48* (2013.01); *H01L 2224/2919* (2013.01); *H01L 2224/29144* (2013.01);
(Continued)

(58) Field of Classification Search
CPC ............... H01L 21/02175; H01L 21/2807; H01L 21/4825; H01L 21/76889; H01L 21/823835; H01L 23/49531; H01L 23/488; H01L 27/1203; H01L 21/723835; H01L 21/28079; H01L 21/045; H01L 23/53209; H01L 23/4951
USPC ......... 257/744, 745, 766, 781, 782, 784, 780, 257/678, 676, 675, E21.006, E21.077, 257/E21.126, E21.127, E21.129, E21.288, 257/E21.459, E21.499, E23.04, E23.051, 257/E23.106
See application file for complete search history.

(56) References Cited

U.S. PATENT DOCUMENTS 3,128,419 A    4/1964    Schering et al.
3,675,089 A    7/1972    Hantusch et al.
(Continued)

FOREIGN PATENT DOCUMENTS

JP    06163735    6/1994

OTHER PUBLICATIONS

Non-Final Office Action mailed Jan. 15, 2015 on U.S. Appl. No. 14/287,142.
(Continued)

*Primary Examiner* — David Nhu
(74) *Attorney, Agent, or Firm* — Sherry W. Schumm

(57) ABSTRACT

Embodiments of a semiconductor device include a primary portion of a substrate, a die, and a die attach layer between the die and the primary portion of the substrate. The die attach layer includes a gold interface layer that includes gold and a plurality of first precipitates in the gold. Each of the first precipitates includes a combination of nickel, cobalt, palladium, gold, and silicon.

20 Claims, 2 Drawing Sheets

(51) Int. Cl.
*H01L 29/40* (2006.01)
*H01L 23/373* (2006.01)
*H01L 23/057* (2006.01)
*H01L 23/00* (2006.01)

(52) U.S. Cl.
CPC ............... *H01L 2224/48091* (2013.01); *H01L 2224/48137* (2013.01); *H01L 2224/48247* (2013.01); *H01L 2224/838* (2013.01); *H01L 2224/83805* (2013.01); *H01L 2924/0105* (2013.01); *H01L 2924/01013* (2013.01); *H01L 2924/01029* (2013.01); *H01L 2924/0132* (2013.01); *H01L 2924/01033* (2013.01); *H01L 2924/01046* (2013.01); *H01L 2924/01078* (2013.01); *H01L 2924/01079* (2013.01); *H01L 2924/01082* (2013.01); *H01L 2924/01322* (2013.01); *H01L 2924/01327* (2013.01); *H01L 2924/0489* (2013.01); *H01L 2924/0665* (2013.01); *H01L 2924/10253* (2013.01)

(56) References Cited

U.S. PATENT DOCUMENTS

| | | |
|---|---|---|
| 3,686,457 A | 8/1972 | Dubac et al. |
| 5,046,656 A | 9/1991 | Schmitt et al. |
| 5,449,930 A | 9/1995 | Zhou |
| 6,084,775 A | 7/2000 | Bartley et al. |
| 6,255,002 B1 * | 7/2001 | Olofsson ..................... 428/620 |
| 6,445,069 B1 | 9/2002 | Ling et al. |
| 6,452,258 B1 | 9/2002 | Abys et al. |
| 7,594,079 B2 | 9/2009 | Yu et al. |
| 8,621,149 B2 | 12/2013 | Fang et al. |
| 8,753,983 B2 * | 6/2014 | Jang et al. ..................... 438/753 |
| 2001/0016374 A1 | 8/2001 | Jiang et al. |
| 2003/0020072 A1 | 1/2003 | Higgins |
| 2004/0108556 A1 | 6/2004 | Kunii et al. |
| 2005/0050278 A1 | 3/2005 | Meier et al. |
| 2005/0221634 A1 | 10/2005 | Hilty et al. |
| 2006/0079021 A1 | 4/2006 | Yang |
| 2007/0205253 A1 | 9/2007 | Hubner |
| 2007/0215996 A1 | 9/2007 | Otemba |
| 2008/0081157 A1 | 4/2008 | Schneegans et al. |
| 2008/0128908 A1 | 6/2008 | Zimmerman et al. |
| 2008/0181277 A1 | 7/2008 | Konig et al. |
| 2008/0274349 A1 | 11/2008 | Chiu et al. |
| 2009/0061169 A1 | 3/2009 | Khaselev et al. |

OTHER PUBLICATIONS

Office Action mailed May 1, 2015 on U.S. Appl. No. 14/287,142.

* cited by examiner

SEMICONDUCTOR DEVICES THAT INCLUDE A DIE BONDED TO A SUBSTRATE WITH A GOLD INTERFACE LAYER

CROSS-REFERENCE TO RELATED APPLICATION

This application is a divisional of U.S. patent application Ser. No. 12/683,961, filed on Jan. 7, 2010, and now issued as U.S. Pat. No. 8,753,983.

BACKGROUND

1. Field

This disclosure relates generally to semiconductor device packaging, and more specifically, to die bonding used in semiconductor device packaging.

2. Related Art

The functionality of semiconductor devices continues to provide very significant utility. Because of the very small size of the die that makes a semiconductor device, the interface with the system of which it is a part is very important. Also the ability to dissipate heat can be very significant. Generally, the die is attached to something rigid that is useful in providing an interface with a system and also may be useful in dissipating heat. In one type of case the die is bonded to a substrate which is useful for physical support and as a heat sink for heat dissipation. An effective way this is done is to bond the metal to the die through a gold/silicon (AuSi) eutectic bond. The back of the die is coated with gold. The substrate may have a first coating that functions as a barrier and a second coating of gold on the first coating. A common composition for the barrier is cobalt and nickel. The gold layers are pressed together and heated to form a eutectic bond to provide physical attachment and for conducting heat. This may provide the desired functions but the gold is quite expensive. Cost continues to be important so there is a need for a lower cost die bond.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A die has a gold coating, and a substrate has a gold layer and a palladium layer. The gold layers of the die and substrate are pressed together and heated to form a eutectic bond in which an intermetallic precipitate comprising gold, palladium, and silicon is formed in the eutectic bond region between the die and the substrate. The eutectic bond is effective for providing the needed attachment and heat conductivity. The thickness of the gold layer on the metal layer is much less than that previously required because of the palladium layer. The combined thickness of the palladium layer and the gold layer on the substrate is much less than the thickness of the gold layer previously required. Gold may be only required on one of the die or substrate prior to forming the eutectic bond. This is better understood by reference to the drawings and the following specification.

The semiconductor substrate of the die described herein can be any semiconductor material or combinations of materials, silicon germanium, silicon-on-insulator (SOI), silicon, monocrystalline silicon, polysilicon, the like, and combinations of the above, that contain silicon.

Figure 1:
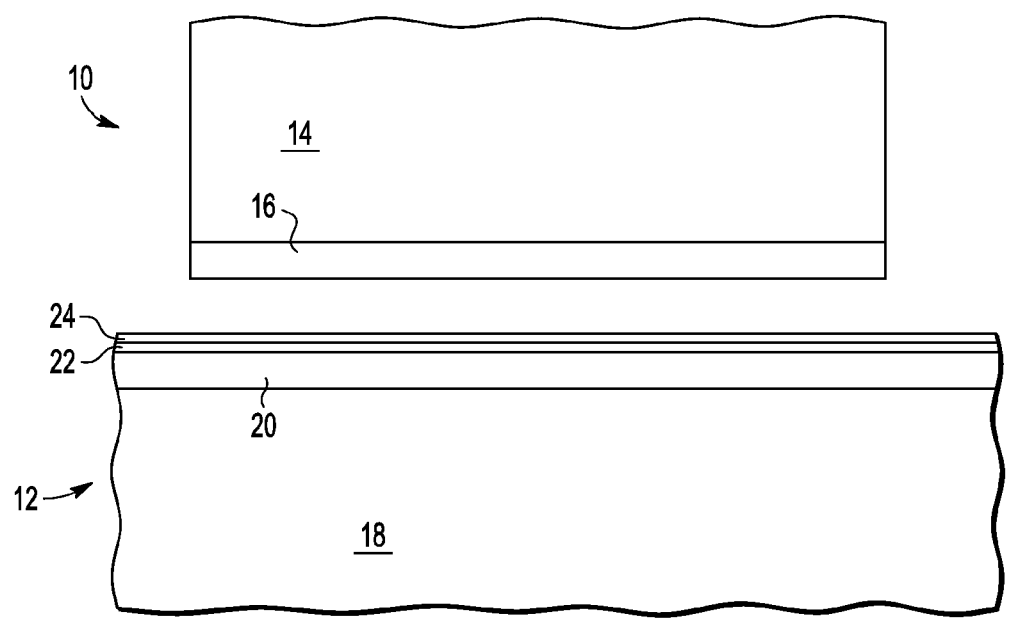
FIG. 1 is a cross section of a heat sink and a die prior to being attached according to an embodiment.

Shown in FIG. 1 is a die structure 10 and a substrate 12 in preparation for a die bonding operation. Die structure 10 comprises a die 14 and a gold layer 16 attached to a backside of die 14. At the interface of the backside of die 14 and gold layer 16, the backside comprises silicon. Substrate 12 has a primary portion 18, a barrier layer 20 on primary portion 18, a palladium layer 22 on barrier layer 20, and a gold layer 24 on palladium layer 22. Primary portion 18 is sufficiently strong to provide physical support for die 14 and be a metal heat sink comprised of copper, CuMoCu, Cu(CuMo)Cu, aluminum, or silicon carbide. Other materials may be used as well. One example is that primary portion 18 may be ceramic. Barrier layer 20 may comprise cobalt and nickel and be about 1-10 microns in thickness. Palladium layer may be 0.03 to 0.5 micron in thickness. Gold layer 24 may be about 0.03 to 0.4 micron in thickness. Gold layer 16 may be about 1.2 microns in thickness which is a common thickness for a gold layer on the backside of a die. Gold layer 24, which is beneficial but may not be necessary, is of a much less thickness than is commonly used for being on a substrate on to which a die will be bonded. As shown in FIG. 1, gold layer 16 is facing gold layer 24 in preparation for a bonding operation which may be a eutectic bonding operation in which gold layers 16 and 24 will be pressed together and heated and in which there is some small movement, called scrubbing, between gold layers 16 and 24.

Figure 2:
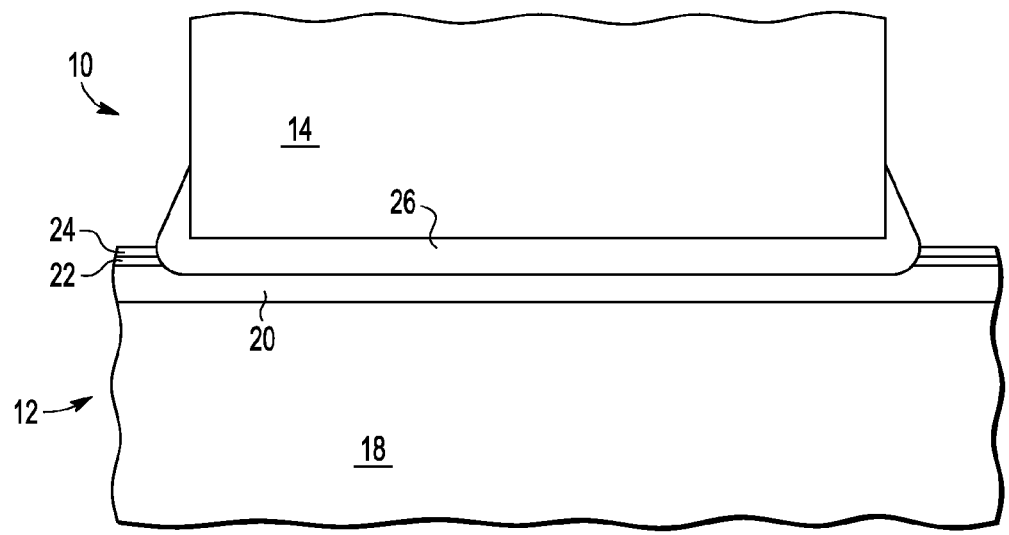
FIG. 2 is a cross section of the heat sink and die of FIG. 1 after being attached.

Shown in FIG. 2 are die 14 and primary portion 18 after the eutectic bonding operation in which gold layers 16 and 24 were brought together with pressure, scrubbing, and heat to form a die attach layer 26. Die attach layer 26 is a combination of gold layers, a small portion of silicon from die 14, gold layer 16, gold layer 24, palladium layer 22, and a portion of barrier layer 20. Die attach layer 26 provides attachment to die 14 and to barrier layer 20. Barrier layer 20 adheres well to primary portion 18. Die attach layer 26 also conducts heat between die 14 and barrier layer 20.

Figure 3:
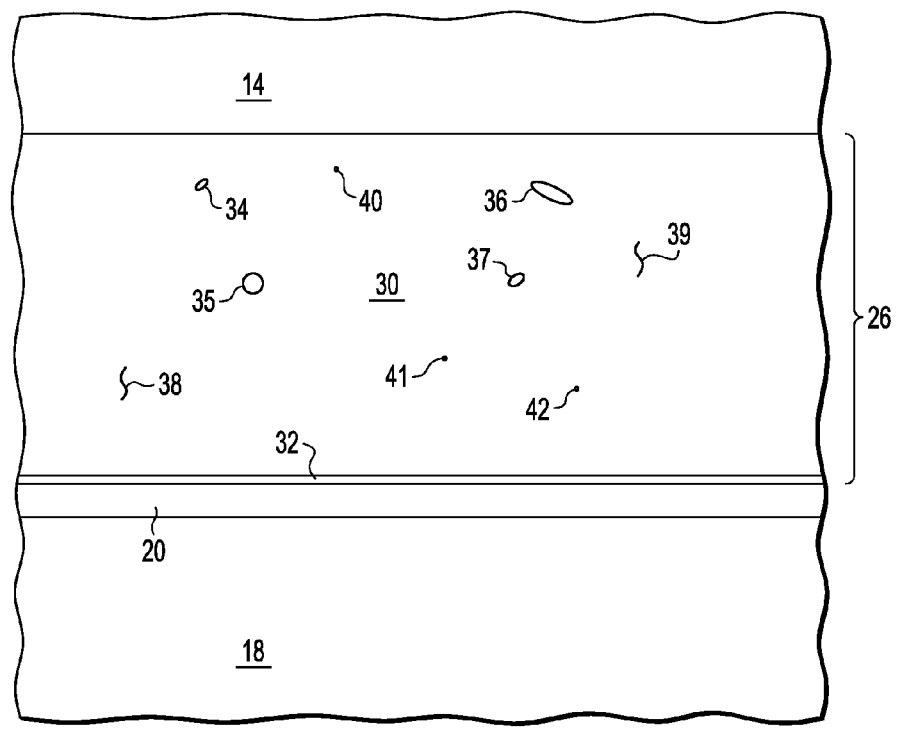
FIG. 3 is a more detailed view, in cross section, of an interface between the heat sink and the die.

Shown in FIG. 3 is a more detailed view of die attach layer 26. Die attach layer 26 includes a thin nickel cobalt silicide layer 32 of less than 0.2 micron at the interface with barrier layer 20. A material other nickel cobalt silicide may be used. One example is nickel silicide. Nickel cobalt silicide layer 32 is likely not to be continuous and not to be of uniform thickness. Die attach layer 26 includes a gold interface layer 30 that may be about 0.1 to 10 microns thick and that comprises gold and precipitates in the gold. The predominate precipitate is combination of palladium (Pd), gold (Au), silicon (Si), cobalt (Co). nickel (Ni) and may be expressed as PdAuSiCoNi. Examples of the PdAuSiCoNi precipitates are PdAuSiCoNi precipitate 34, PdAuSiCoNi precipitate 35, PdAuSiCoNi precipitate 36, and PdAuSiCoNi precipitate 37. PdAuSiCoNi precipitates 34-37 are spherical or elliptical and vary in size but can be 0.1 micron in diameter. May more PdAuSiCoNi would be present than shown in FIG. 3. Another precipitate is nickel cobalt silicide which are shown in FIG. 3 as silicide precipitates 38 and 39 and which are formed as strings that can be 0.2 micron in length. Another likely precipitate is silicon. This is shown in FIG. 3 as silicon precipitates 40, 41, and 42. The silicon precipitates may not actually occur. When they do, they are much smaller than the PdAuSiCoNi and silicide precipitates. The silicon precipitates and the silicide precipitates total less than 10 percent of the volume of gold interface layer 30. On the other hand, PdAuSiCoNi precipitates form a significant percentage of the volume of gold interface layer 30. The percentage can easily be 5 to 70 percent. It is believed that all of the gold and palladium with some silicon become liquid at the die attach temperature and then precipitates out as an intermetallic and gold layer.

The eutectic process is performed by joining substrate 12 and die structure at a temperature that is preferably between 390 to 430 degrees Celsius but could be at other temperatures such as between 370 degrees Celsius and 450 degrees Celsius. A force of about 30 gram force is applied between die structure 10 and substrate 12. This is applied for about one minute. The scrubbing is performed with an amplitude of about 10 microns at a frequency of about 100 hertz. Other forces and scrubbing parameters may be used instead.

The prior art approach of using two gold layers of multimicron thickness without palladium also formed a thin silicide layer like silicide layer 32 with silicide and perhaps silicon precipitates. The precipitates of this prior art approach were of minimal percentage of the resulting gold interface layer, less than 30 percent by volume.

The affect of die attach layer 26 is to provide a degree of attachment and heat conduction that is comparable to that of the described prior art approach but with reduced cost. Palladium is currently about ⅓ the cost of gold on a weight basis but gold has about twice the density. Thus, a given thickness of palladium will be about ⅙ the cost of the same thickness of gold. Further the thickness of the palladium layer as described is only about 0.03 to 0.5 micron whereas the described prior art approach uses about 1.5 to 2.5 microns of gold on the substrate side while retaining the same gold thickness on the die side. The surface area on the substrate that is coated with gold is much greater than the area of the backside of the die. This ratio of areas can easily be 30 to 1. Thus a reduction of thickness of the gold on the substrate side saves significantly more gold than the same reduction in thickness of gold on the die side. In fact, gold on the back side of the die can be increased to 2.5 microns if needed. The reason why palladium and the consequent formation of PdAuSiCoNi precipitates results in significantly reducing the need of gold, especially on the substrate side, while obtaining the desired adhesion and heat conduction is not fully understood, but it is believed the PdAuSiCoNi precipitates provide for a stronger bond for a given thickness of a resulting gold interface layer such as gold interface layer 30. Also that the cobalt and nickel may not be required in the precipitate. Their presence occurs because of the presence of the barrier layer, but the effectiveness of gold interface layer 30 is not believed to require cobalt or nickel in the palladium-containing precipitates. Thus, if barrier layer 20 can be found to not be required, then it is believed to not be required for the gold interface layer. Thus altering the palladium-containing precipitates of gold interface layer 30 by removing the cobalt and nickel would result in an effective gold interface layer.

An option can be to put all of the gold on the die side so that substrate 12 will not have a gold layer but will have the palladium layer exposed and be the surface that comes in contact with the die in the bonding process. This may simplify the process a little by not requiring the step of plating gold on the substrate. Also any reduction in gold on the substrate side potentially saves more gold because of the comparatively large area of the substrate. It's also possible to put all of the gold on the substrate side, but this is putting gold on the side with the larger area so that the cost savings is reduced.

Figure 4:
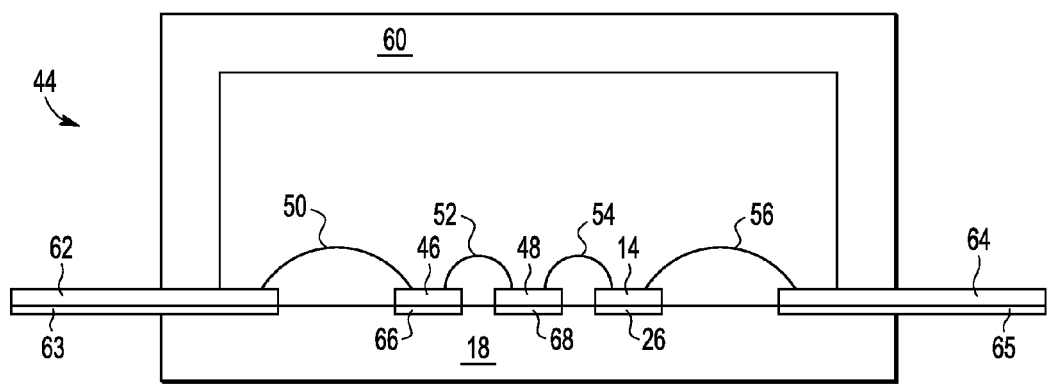
FIG. 4 is a cross section of the die and heat sink as part of a packaged device.

Shown in FIG. 4 is a packaged device 44 comprising die 14, a die 46 and a die 48 attached to primary portion 18 of substrate 12 through die attach layers 26, 66, and 68, respectively. Packaged device 44 further comprises leads 62 and 64, a cap 60, and wire bonds 50, 52, 54, and 56. Leads 62 and 64 extend laterally and have underlying insulating layers 63 and 65 respectively, for the case where primary portion 18 is conductive. A cap 60 covers die 14, 46, and 48 and is on leads 62 and 64 so that each of leads 62 and 64 have an inner portion available for wire bonding and an outer portion for connecting to a system. Wire bond 50 is connected between the inner portion of lead 62 and die 46. Wire bond 52 is connected between die 46 and die 48. Wire bond 54 is connected between die 48 and die 14. Wire bond 56 is connected between die 14 and the inner portion of lead 64. Other die could also be present. Additional wire bonds among the die and between the die and other leads are also present. Die attach layers 26, 66, and 68 can be formed at the same time. Thus multiple die can be formed on the same substrate and in the same package using the described technique of forming die attach layers such as die attach layer 26. Passive elements made with ceramic, silicon, and gallium arsenide can also be included with a gold/tin or epoxy attach. This also shows the much greater area of a substrate compared to the backside of the die. For a gold plating process, it is also likely that all sides of the substrate will be coated with gold. Thus any savings in thickness can be very significant.

By now it should be appreciated that there has been a method for forming a semiconductor device. The method includes providing a silicon-containing die having a first surface. The method further includes providing a heat sink having a palladium layer over a first surface of the heat sink, wherein a first gold layer is located over one of a group consisting of the palladium layer and the first surface of the silicon-containing die. The method further includes bonding the silicon-containing die to the heat sink. The bonding includes joining the silicon-containing die and the heat sink such that the first gold layer and the palladium layer are between the first surface of the silicon-containing die and the first surface of the heat sink. The bonding further includes heating the first gold layer and the palladium layer to form a die attach layer between the first surface of the silicon-containing die and the first surface of the heat sink, the die attach layer comprising a gold interface layer having a plurality of intermetallic precipitates, each of the plurality of intermetallic precipitates comprising palladium, gold, and silicon. The method may have a further characterization by which the step of providing the silicon-containing die is further characterized in that the first gold layer is located over the first surface of the silicon-containing die. The method may have a further characterization by which wherein the step of providing the heat sink is further characterized in that the heat sink has a second gold layer over the palladium layer, and wherein the step of joining is further characterized in that the first gold layer, the second gold layer, and the palladium layer are between the first surface of the silicon-containing die and the first surface of the heat sink, and wherein the step of heating is further characterized in that the silicon from the silicon-containing die, the first gold layer, the second gold layer, and the palladium layer are heated to form the die attach layer. The method may have a further characterization by which the step of providing the heat sink is further characterized in that the heat sink has a barrier layer over the first surface of the heat sink, the palladium layer being over the barrier layer, wherein the step of joining is further characterized in that the first gold layer, the second gold layer, the palladium layer, and the barrier layer are between the first surface of the silicon-containing die and the first surface of the heat sink, and wherein the step of heating is further characterized in that silicon from the silicon-containing die, the first gold layer, the second gold layer, the palladium layer, and the barrier layer are heated to form the die attach layer. The method may have a further characterization by which the step of providing the heat sink is further characterized in that the heat sink has a barrier layer over the first surface of the heat sink, wherein the palladium layer is over the barrier layer. The method may have a further characterization by which the step of providing the heat sink is further characterized in that the barrier layer comprises nickel, and wherein the step of heating is further characterized in that the first gold layer, the palladium layer, and the barrier layer are heated to form the die attach layer, wherein a portion of the barrier layer forms a nickel-containing silicide layer, wherein the die attach layer comprises the nickel-containing silicide layer, and the nickel-containing silicide layer is between the gold interface layer and the barrier layer. The method may have a further characterization by which the step of bonding is further characterized in that each of the plurality of intermetallic precipitates further comprises nickel. The method may have a further characterization by which the step of bonding is further characterized in that the die attach layer has a thickness in a range of 0.1 to 10 microns. The method may have a further characterization by which the step of bonding is further characterized in that, after the step of joining, the first gold layer is in contact with a silicon portion of the silicon-containing die.

Also described is a method for forming a semiconductor device. The method includes providing a silicon-containing die having a first gold layer over a first surface of the silicon-containing die. The method further includes providing a heat sink having a palladium layer over a first surface of the heat sink, and a second gold layer over the palladium layer. The method further includes bonding the silicon-containing die to the heat sink, wherein the bonding comprises bringing the first gold layer into contact with the second gold layer and heating the first gold layer, the second gold layer, and the palladium layer to form a die attach layer between the first surface of the silicon-containing die and the first surface of the heat sink, the die attach layer comprising a gold interface layer having a plurality of intermetallic precipitates, each of the plurality of intermetallic precipitates comprising palladium, gold, and silicon. The method may have a further characterization by which the step of providing the heat sink is further characterized in that the heat sink has a barrier layer over the first surface of the heat sink, wherein the palladium layer is over the barrier layer. The method may have a further characterization by which step of providing the heat sink is further characterized in that the barrier layer comprises nickel, and wherein the step of heating is further characterized in that the first gold layer, the palladium layer, and the barrier layer are heated to form the die attach layer, wherein a portion of the barrier layer forms a nickel-containing silicide layer, wherein the die attach layer comprises the nickel-containing silicide layer, and the nickel-containing silicide layer is between the gold interface layer and the barrier layer. The method may have a further characterization by which the step of bonding is further characterized in that each of the plurality of intermetallic precipitates further comprises nickel. The method may have a further characterization by which the step of providing the heat sink is further characterized in that the barrier layer comprises nickel cobalt, and wherein the step of bonding is further characterized in that each of the plurality of intermetallic precipitates further comprises nickel and cobalt.

The method may have a further characterization by which the step of bonding is further characterized in that the die attach layer has a thickness in a range of 0.1 to 10 microns. The method may have a further characterization by which the step of providing the silicon-containing die is further characterized in that the first gold layer has a thickness in a range of 1.2 to 2.0 microns. The method may have a further characterization by which the step of providing the heat sink is further characterized in that the second gold layer has a thickness in a range of 0.03 to 0.4 micron, and the palladium layer has a thickness in a range of 0.03 to 0.5 micron. The method may further comprise packaging the silicon-containing die to form a packaged semiconductor device, wherein the packaging comprises forming an electrical connection between a second surface of the silicon-containing die, opposite the first surface of the silicon-containing die, and an external lead of the packaged semiconductor device.

Described also is a semiconductor device. The semiconductor device includes a heat sink. The semiconductor device further includes a silicon-containing die attached to the heat sink with a die attach layer, wherein the die attach layer comprises a gold interface layer having a plurality of intermetallic precipitates, each of the plurality of intermetallic precipitates comprising palladium, gold, and silicon. The semiconductor device may further include a nickel-containing barrier layer between the die attach layer and the heat sink, and wherein the die attach layer comprises a nickel-containing silicide layer between the gold interface layer and the nickel-containing barrier layer, and wherein each of the plurality of intermetallic precipitates comprises palladium, gold, silicon, and nickel.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, other packing approaches may be used such as an encapsulation technique that does not have a cavity. The barrier layer may be of another material and may not even be necessary. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device comprising:
a primary portion of a substrate;
a die; and
a die attach layer between the die and the primary portion of the substrate, the die attach layer comprising a gold interface layer that includes gold and a plurality of first precipitates in the gold, wherein each of the plurality of first precipitates comprises a combination of nickel, cobalt, palladium, gold, and silicon.

2. The semiconductor device according to claim 1, further comprising:
a nickel-containing barrier layer between the die attach layer and the primary portion of the substrate.

3. The semiconductor device according to claim 2, wherein the nickel-containing barrier layer has a thickness in a range of 1 to 10 microns.

4. The semiconductor device according to claim 2, wherein the die attach layer comprises a nickel-containing silicide layer between the gold interface layer and the nickel-containing barrier layer.

5. The semiconductor device according to claim 4, wherein the nickel-containing silicide layer comprises a nickel cobalt silicide layer.

6. The semiconductor device according to claim 4, wherein the nickel-containing silicide layer comprises a nickel silicide layer.

7. The semiconductor device according to claim 4, wherein the nickel-containing silicide layer has a thickness of less than 0.2 micron.

8. The semiconductor device according to claim 1, wherein the gold interface layer has a thickness in a range of 0.1 to 10 microns.

9. The semiconductor device according to claim 1, wherein the first precipitates are spherical or elliptical and can have a diameter of 0.1 micron.

10. The semiconductor device according to claim 1, wherein the gold interface layer further comprises second precipitates of nickel cobalt silicide.

11. The semiconductor device according to claim 10, wherein the second precipitates are formed as strings that can have a length of 0.2 micron.

12. The semiconductor device according to claim 10, wherein the gold interface layer further comprises third precipitates of silicon.

13. The semiconductor device according to claim 12, wherein the second precipitates and the third precipitates total less than 10 percent of a volume of the gold interface layer.

14. The semiconductor device according to claim 1, wherein the first precipitates form between 5 and 70 percent of a volume of the gold interface layer.

15. The semiconductor device according to claim 1, wherein the primary portion of the substrate is formed from a material selected from copper, copper molybdenum copper (CuMoCu), Cu(CuMo)Cu, aluminum, silicon carbide, and ceramic.

16. The semiconductor device according to claim 1, wherein a backside of the die comprises silicon.

17. The semiconductor device according to claim 1, wherein the gold interface layer is in contact with a silicon portion of the die.

18. A packaged semiconductor device comprising:
a primary portion of a substrate;
a silicon-containing die;
a die attach layer between the silicon-containing die and the primary portion of the substrate, the die attach layer comprising a gold interface layer that includes gold and a plurality of first precipitates in the gold, wherein each of the plurality of first precipitates comprises a combination of nickel, cobalt, palladium, gold, and silicon;
a plurality of leads; and
a plurality of wirebonds electrically connecting the silicon-containing die and the plurality of leads.

19. The packaged semiconductor device according to claim 18, wherein the primary portion of the substrate is conductive.

20. The packaged semiconductor device according to claim 19, further comprising:
insulating layers between the primary portion of the substrate and the plurality of leads.

* * * * *